(12) United States Patent
Reeder et al.

(10) Patent No.: US 7,176,683 B2
(45) Date of Patent: Feb. 13, 2007

(54) ITERATIVE DECOMPOSITION OF WATER AND FAT WITH ECHO ASYMMETRY AND LEAST SQUARE ESTIMATION

(75) Inventors: Scott B. Reeder, Menlo Park, CA (US); Angel R. Pineda, San Francisco, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 35 days.

(21) Appl. No.: 11/124,041

(22) Filed: May 6, 2005

(65) Prior Publication Data

US 2006/0250131 A1 Nov. 9, 2006

(51) Int. Cl.
*G01V 3/00* (2006.01)
(52) U.S. Cl. ...................... 324/307; 324/309
(58) Field of Classification Search ............... 324/307, 324/309
See application file for complete search history.

(56) References Cited

U.S. PATENT DOCUMENTS

| | | | | |
|---|---|---|---|---|
| 5,168,227 A | * | 12/1992 | Foo et al. | 324/309 |
| 5,225,781 A | * | 7/1993 | Glover et al. | 324/309 |
| 5,243,284 A | | 9/1993 | Noll | |
| 6,016,057 A | * | 1/2000 | Ma | 324/309 |

OTHER PUBLICATIONS

Bredella et al., "*Three-Point Dixon Chemical-Shift Imaging for Evaluating Articular Cartilage Defects in the Knee Joint on a Low-Field-Strength Open Magnet*", AJR (177) 1371-1375, Dec. 2001.

Dixon, Thomas W., "*Simple Proton Spectroscopic Imaging*", Radiology 1984, (153) 189-194.

Glover, Gary H., "*Multipoint Dixon Technique for Water and Fat Proton and Susceptibility Imaging*", JMRI 1991 (1) 521-530.

Reeder et al., "*Multicoil Dixon Chemical Species Separation With and Iterative Least-Squares Estimation Method*", MRM (51) 35-45 2004.

Reeder et al., "*Rapid MR Imaging of Articular Cartilage with Steady_State Free Precession and Multipoint Fat-Water Separation*", AJR (180) Feb. 2003, 357-362.

Reeder et al., "*Rapid Cartilage Imaging with SSFP and Four-Point Dixon Techniques*", ISMRM, May 24, 2002.

Rybicki et al., "*Fast Three-Point Dixon MR Imaging Using Low-Resolution Images for Phase Correction: A Comparison with Chemical Shift Selective Fat Suppression for Pediatric Musculoskeletal Imaging*", AJR (177) Nov. 2001, 1019-1023.

Xiang, Qing-San, "*Water-Fat Imaging with Direct Phase Encoding*", JMRI 1997, (7) 1002-1015.

\* cited by examiner

*Primary Examiner*—Louis M. Arana
(74) *Attorney, Agent, or Firm*—Beyer Weaver & Thomas LLP (57) ABSTRACT

A method of separating signals from water and lipid in a body using spin-echo magnetic resonance imaging comprising steps of acquiring image signals at three acquisition times asymmetrically positioned with respect to a spin-echo time, the three acquisition times being separated by $2\pi/3$ and the middle signal acquisition is centered at $\pi/2+\pi k$ where k is an integer, and combining the plurality of image signals iterative using a least squares decomposition method.

9 Claims, 10 Drawing Sheets

ITERATIVE DECOMPOSITION OF WATER AND FAT WITH ECHO ASYMMETRY AND LEAST SQUARE ESTIMATION

GOVERNMENT RIGHTS

The U.S. government has rights in the disclosed invention pursuant to NIH grants to Stanford University including P41RR09784 and No. 1R01-EB002524.

BACKGROUND OF THE INVENTION

This invention relates generally to magnetic resonance imaging (MRI), and more particularly the invention relates to species signal separation in MRI, such as water and fat signal separation.

Uniform fat separation is necessary for many MRI applications and can be challenging in the presence of main field, Bo, inhomogeneities.

As noted by Reeder et al. in U.S. Pat. No. 6,856,134 for "Magnetic Resonance Imaging With Fat-Water Signal Separation", in phase and out of phase imaging was first described by Dixon in 1984 and was used to exploit the difference in chemical shifts between water and fat in order to separate water and fat into separate images. Glover further refined this approach in 1991 with a three-point method that accounts for Bo field inhomogeneities. Hardy et al first applied this method to fast spin-echo imaging (FSE) by acquiring three images with the readout centered at the spin-echo for one image and symmetrically before and after the spin-echo in the subsequent two images. These water-fat separation methods have since been combined with both spin-echo (SE) and FSE imaging for many applications (8–13). Several of these three-point approaches acquire one image with the readout centered at the spin-echo and the other two acquired symmetrically on each side of the spin-echo. This approach has the advantage of minimizing the time between refocusing pulses of the fast spin-echo train while providing sufficient time between echoes for phase between water and fat to evolve. Initial descriptions of the relationship between echo spacing and noise performance of water-fat decomposition have been reported, however, these approaches do not fully characterize the theoretical noise performance of water-fat separation methods.

Heretofore, decomposition of water from fat with Dixon methods has not been possible when the proportion of water and fat within a voxel is approximately equal.

SUMMARY OF THE INVENTION

In accordance with an embodiment of the invention, the decomposition of species signals, such as water signals from fat signals, using signal phase separation due to chemical shifts between water and fat utilizes at least three image signals acquired asymmetrically about a spin echo in a MRI imaging sequence. The signals are processed using an iterative least-squares decomposition algorithm to maximize noise performance. The invention will be referred to herein as IDEAL for Iterative Decomposition of Water and Fat with Echo Asymmetry and Least Square Estimation. In preferred embodiments, an optimal echo combination is created when the phase of three echoes is separated by $2\pi/3$ and the middle echo is centered at $\pi/2+\pi k$, where k is an integer. With these echo combinations, noise performance can reach a best possible maximum and is independent of the relative proportions of water and fat within a voxel.

As noted above, the invention is not limited to water and fat or to only two species. Further, the invention is applicable to any imaging technique with an echo-coherent time but will be described with reference to spin-echo (SE) and fast spin-echo (FSE).

The invention and objects and features thereof will be more readily apparent from the following detailed description and appended claims when taken with the drawings.

BRIEF DESCRIPTION OF THE DRAWINGS

192, FOV=40 cm, slice/gap=9 mm/5 mm, echo train length=10, BW=±31.25 kHz, total scan time for pelvis=5:05 min.

DETAILED DESCRIPTION

Symmetric echoes, as well as asymmetric echoes used in accordance with the invention can be understood intuitively by the realization that complex images acquired symmetrically before or after a spin-echo, are Hermitian conjugates of one another, and therefore contain the same information. In addition, all phase information is lost in echoes that are acquired at the spin-echo when chemical shift and field inhomogeneities are fully refocused. In general, at least three unique images acquired at different echo times are required to resolve water from fat. If an image is acquired when the phase of water and fat are orthogonal, i.e.: phase shift between water and fat is $\pi/2+\pi k$ (k=any integer) and there are no additional phase shifts from field inhomogeneities or other sources (e.g. coil, receivers, flow, etc), water and fat could, in theory, be resolved simply from the real and imaginary components of this image, respectively. However, two additional images are needed, to compensate for field inhomogeneities and constant phase shifts. These additional echoes are ideally positioned so that the phase shift from water-fat chemical shift is equally sampled around the unit circle, i.e.: $2\pi/3$ before and after the middle image that is acquired at $\pi/2+\pi k$.

Figure 1:
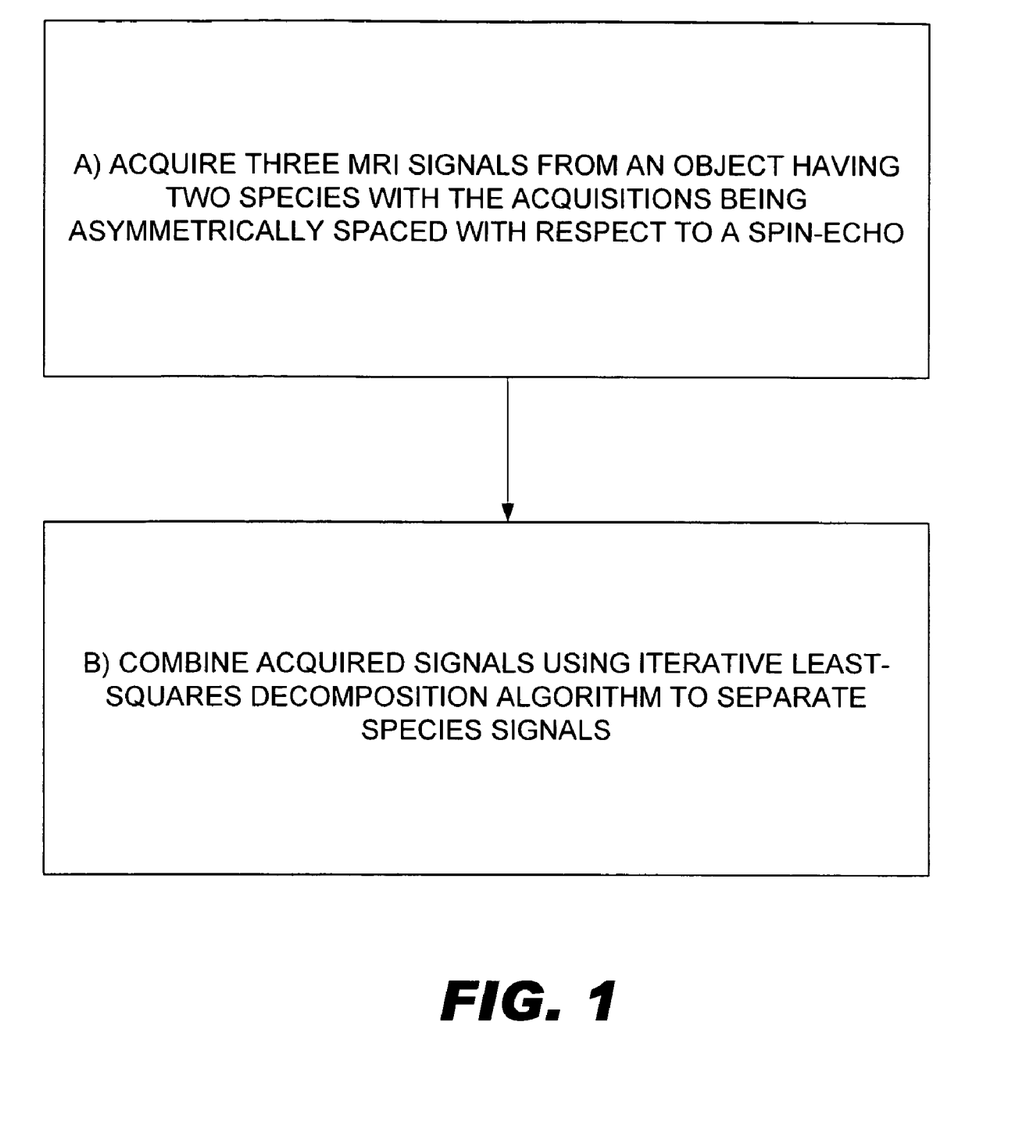
FIG. 1 is a flow diagram of the iterative decomposition process in accordance with an embodiment of the invention.

An embodiment of the invention is summarized in the flow diagram of FIG. 1. Using a spin-echo (SE) imaging sequence, three MRI signals are acquired asymmetrically with respect to the spin-echo of the sequence. The three image signals are then combined iteratively using a least squares decomposition algorithm, as described in Reeder et al. "*Multicoil Dixon Chemical Species Separation with an Iterative Least-Squares Estimation Method*", Magn Reson Med 2004; 51:35–45.

As described in the above paper, the following algorithm summarizes the method used to determine the least-squares estimates of water images and fat images for each pixel:

1. Estimate the signal from each chemical species using an initial guess for the field map, $\Psi_o$. A useful initial guess for $\Psi_o$ is zero [HZ].
2. Calculate the error to the field map, $\Delta\Psi$.
3. Recalculate $\Psi=\Psi_o+\Delta\Psi$.
4. Recalculate species signal, $\hat{S}_n$, with the new estimate of $\Psi$.
5. Repeat the preceding three steps until $\Delta\Psi$ is small (e.g., <1 Hz).
6. Spatially filter (smooth) the final field map, $\Psi$, with a low-pass filter.
7. Recalculate the final estimate of each chemical species image.

The final field map is filtered to improve noise performance, as discussed below.

In theory, the phase shift between water and fat as a result of chemical shift is $$\theta = 2\pi \Delta f \, t \qquad (1)$$

where $\Delta f$ is the chemical shift (Hz) between water and fat, and t is the time relative to the spin-echo. It is preferable to calculate echo shifts in terms of $\theta$, rather than t, because $\theta$ is independent of field strength and provides more physical intuition.

The noise performance of a water-fat decomposition is conveniently described with the effective number of signal averages, or NSA, which can be defined as $$NSA = \frac{\sigma^2}{\sigma_p^2} \qquad (2)$$

where $\sigma^2$ is the variance of the noise in a source image and $\sigma_p^2$ is the variance of the noise in a calculated water or fat image. Eq. 2 is a helpful measure of the noise performance of a water-fat decomposition. For any three-point water-fat decomposition method, the maximum possible NSA is three, which is equivalent to what would be obtained if the object contained only water or only fat, and the three source images were averaged.

Figure 2A:
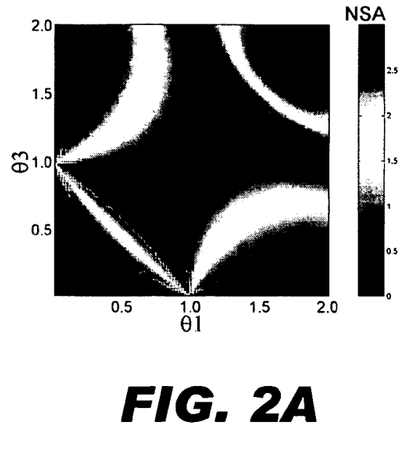
FIGS. 2A, 2B are theoretical NSA calculated against $\theta_1$ and $\theta_3$ for a voxel with a) all water, and b) water=fat, when $\theta_2$ is fixed at zero at the spin-echo. Symmetrically acquired echoes occur along the dashed line. Phase is plotted in units of $\pi$. The asterisk indicates the optimal spacing ($2\pi/3$) for the case when the voxel contains all water.
Figure 2B:
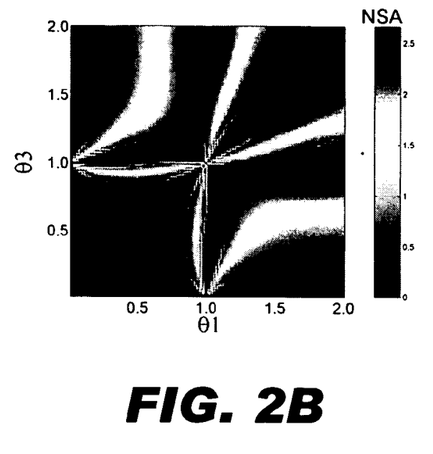

FIG. 2A is a 2D plot of the theoretical maximum NSA of a calculated water image from three source images acquired with echoes $\theta_1$ and $\theta_3$ shifted with respect to the spin-echo, when $\theta_2$ is held fixed at zero and the voxel contains mostly water. For symmetrically acquired echoes (dashed line), the NSA increases to a maximum of three when $\theta_1 = -2\pi/3$ and $\theta_3 = 2\pi/3$ (asterisk, FIG. 2A). This combination of echoes ($-2\pi/3$, 0, $2\pi/3$) is the optimal choice for this case and is an intuitive result, which reflects equal sampling around the unit circle. FIG. 2B plots the theoretical NSA for equal proportions of water and fat. From this plot it can be seen that NSA is zero for almost all choices of $\theta_1$ and $\theta_3$ reflecting the fact that any water-fat decomposition method is unable to resolve water from fat when they are in equal proportions. The only echo combination that produces a non-zero NSA is $(-\pi, 0, \pi)$. However, this is a singular result and any small deviation from this echo spacing (e.g. $-0.99\pi$, 0, $0.99\pi$) results in NSA~0 at this fat:water ratio. The overall behavior of FIG. 3 agrees with the geometrical prediction made by Wen et al.

Figure 3A:
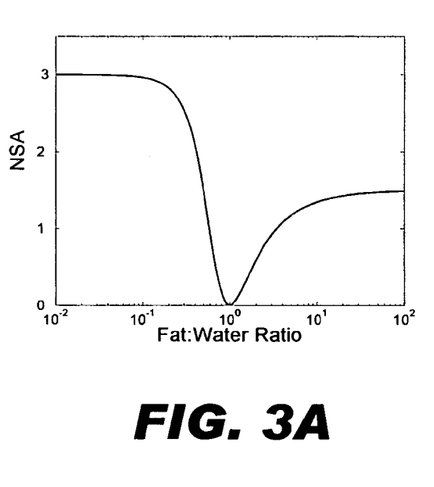
FIGS. 3A, 3B are plots of theoretical maximum NSA of pixels in a calculated water image, as a function of fat:water ratio for a) symmetric echoes ($-2\pi/3$, 0, $2\pi/3$; black curve), and b) asymmetric echoes ($-\pi/6$, $\pi/2$, $7\pi/6$).

This effect is better illustrated in FIG. 3A, which plots the theoretical maximum NSA of a calculated water image against fat:water ratio for symmetrically spaced echoes $(-2\pi/3, 0, 2\pi/3)$. From this figure it can be seen that NSA meets the theoretical maximum (three) when the voxel contains mostly water, and there is a broad minimum when water and fat are in similar proportions. It is also interesting to note that the theoretical NSA only recovers to approximately 1.4 when the voxel contains mostly fat.

Figure 3B:
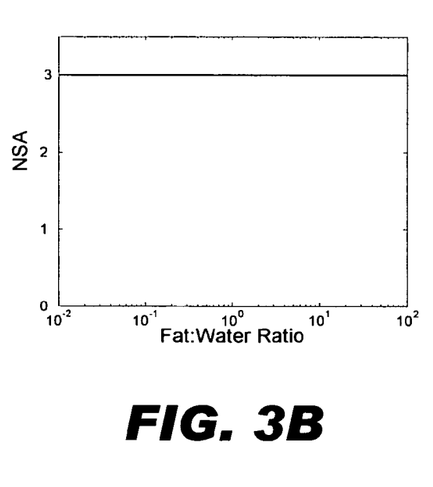

Calculating NSA over a wide range of echo shifts $(\theta_1, \theta_2, \theta_3)$ and fat:water ratios was performed to determine the combination that maximized noise performance. From this analysis it was found that the combination of three echoes that maximized NSA are those separated by $2\pi/3$, with the middle echo centered at $\pi/2+\pi k$ (k=any integer), i.e.: $(-\pi/6+\pi k, \pi/2+\pi k, 7\pi/6+\pi k)$. For practical SE and FSE applications, the optimal echo combinations that minimize time between refocusing pulses are $(-\pi/6, \pi/2, 7\pi/6)$ or $(-7\pi/6, -/2, \pi/6)$, which are equivalent from the perspective of refocusing pulse spacing. FIG. 3B plots the theoretical maximum NSA against fat:water ratio for asymmetric echoes (IDEAL). Tremendous improvement in NSA from asymmetric echoes is seen when compared with symmetric echoes, as the NSA reaches the upper limit of three, and is independent of the fat:water ratio within a voxel.

Figure 4A:
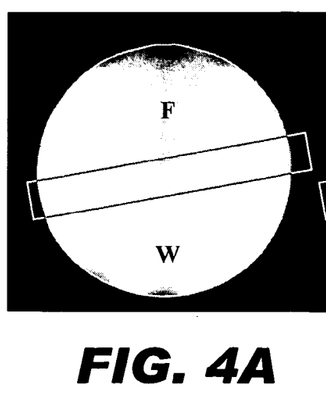
FIGS. 4A–4C are axial IDEAL FSE images through the oil-water phantom at 1.5T schematically illustrating the obliquely prescribed slice, a) recombined image, b) calculated water image, c) calculated fat image. This slice creates a continuum of water:fat ratios across the slice through partial-volume effects. Note that there is a small amount of water signal with the oil region (b). W=water, F=fat.
Figure 4B:
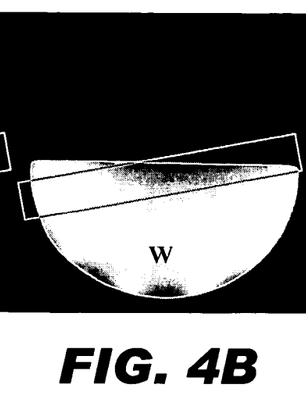
Figure 4C:
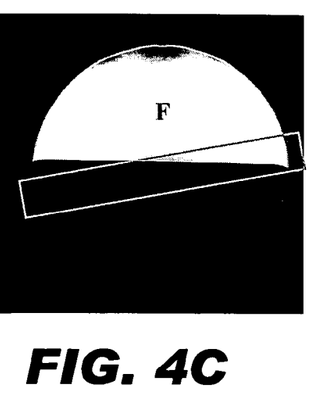
Figure 5A:
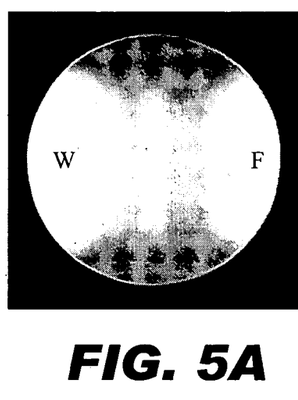
FIGS. 5A–5H are oblique FSE images acquired through the oil-water interface of the oil-water phantom with the IDEAL method (-p/6, p/2, 7p/6; top row), and symmetric echoes (-p/2, 0, p/2; bottom row). Recombined (a,d), calculated water (b,e) and calculated fat (c,f) images show irregular and noisy signal when water and fat are in similar proportions (black arrows). (g,h) are the same water images as (b,e) but enlarged and windowed to demonstrate better the increased noise in water image from the symmetric acquisition (h) in region that contains a small amount of water, but is mostly fat (white arrow). W=water, F=fat.
Figure 5B:
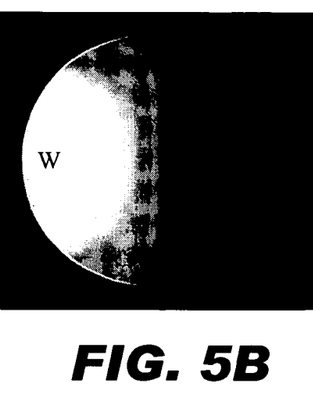
Figure 5C:
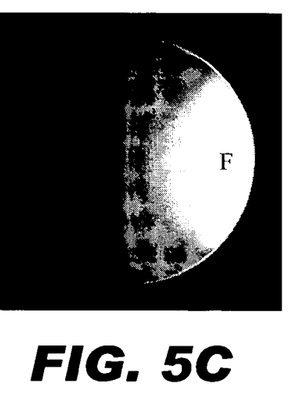
Figure 5D:
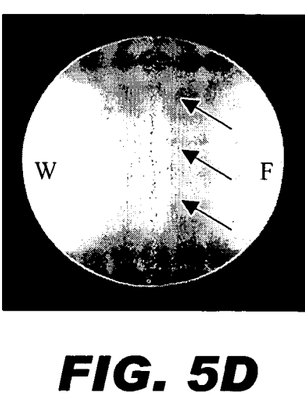
Figure 5E:
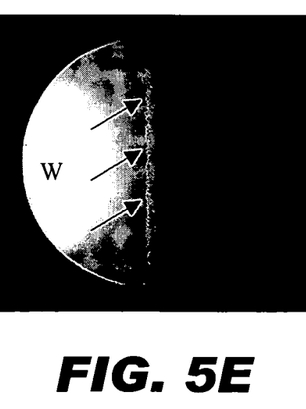
Figure 5F:
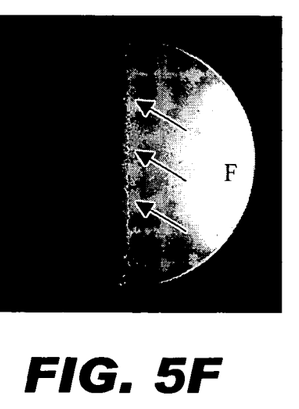
Figure 5G:
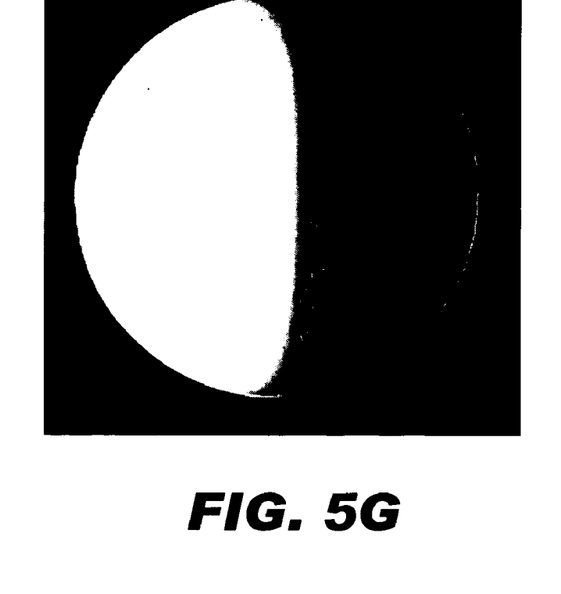
Figure 5H:
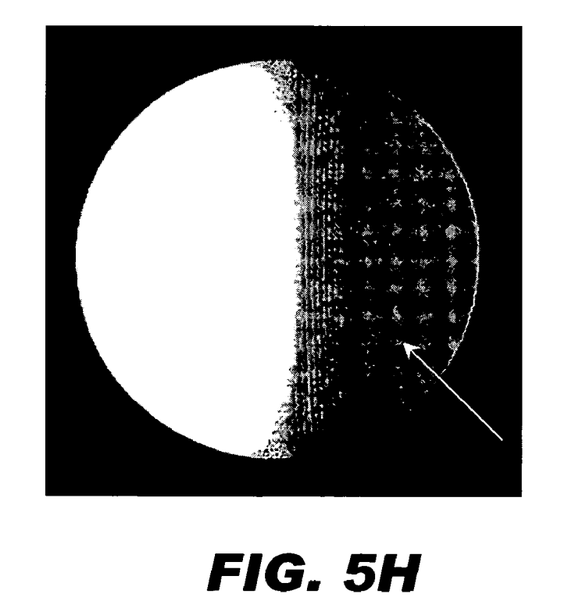
Figure 6A:
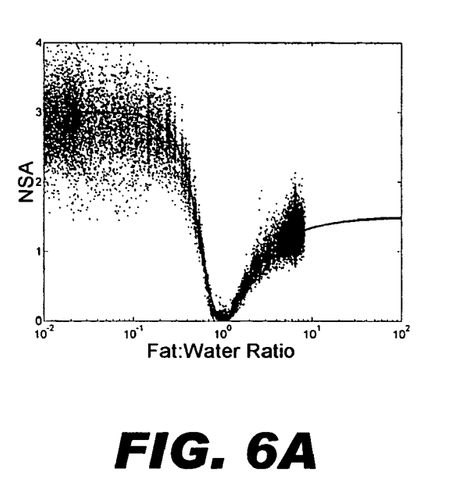
FIGS. 6A–6D are experimentally measured NSA (dots) plotted against measured fat:water ratio for a) symmetric echoes ($-2\pi/3$, 0, $2\pi/3$, b) symmetric echoes ($-\pi/2$, 0, $\pi/2$, c) asymmetric echoes ($-\pi/6$, $\pi/2$, $7\pi/6$, and d) asymmetric echoes with shortened echo spacing (0, $\pi/2$, $\pi$). Smooth black lines indicate the theoretical maximum NSA for pixels in the calculated water image. Excellent agreement between experimental measurements and theory is seen.
Figure 6B:
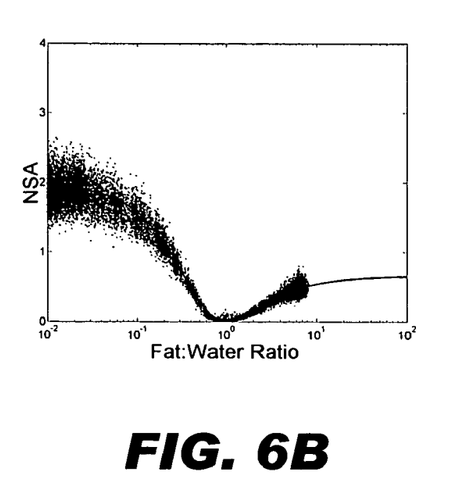
Figure 6C:
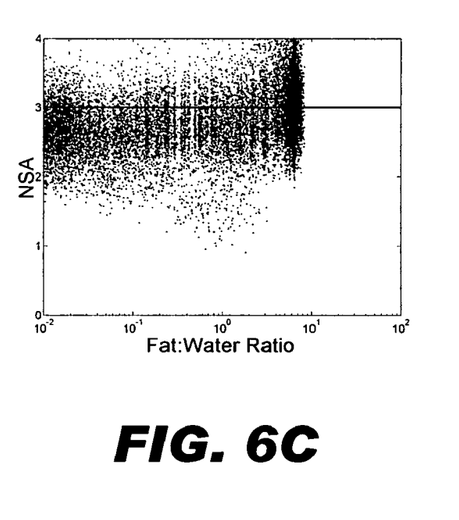
Figure 6D:
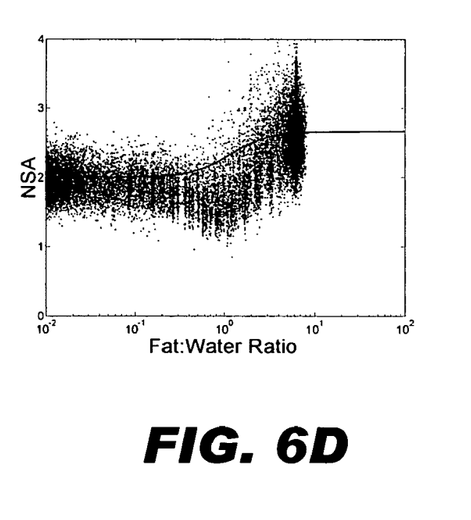
Figure 7A:
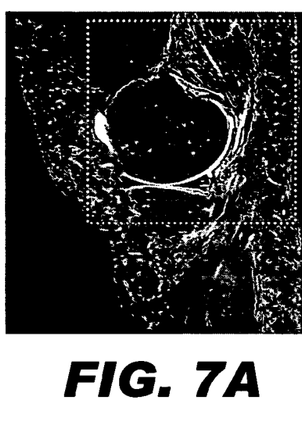
FIGS. 7A–7F are sagittal T2W FSE images through the knee of a normal volunteer at 3.0T using a) symmetric echoes (-2pi/3, 0, 2pi/3), b) asymmetric echoes (-pi/6, pi/2, 7pi/6) (IDEAL), and c) fat-saturation. Images in second row (d-f) are close up views of corresponding images in a-c. Note the irregular margins between muscle and fat in the symmetric echo image (white arrows), as well as increased noise in the bone marrow and subcutaneous fat. Image parameters: TR/TE=5000/48, 384×192, FOV=16 cm, slice/gap=3.0 mm/0.5 mm, echo train length=10, BW=±31.25 kHz, total scan time for entire knee=5:05 min.
Figure 7B:
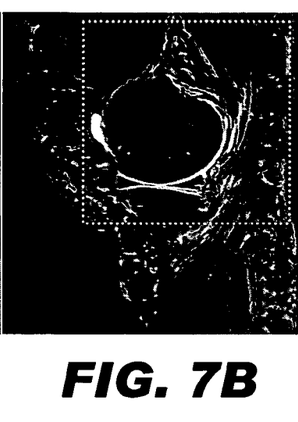
Figure 7C:
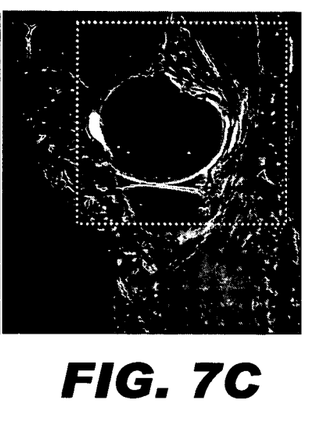
Figure 7D:
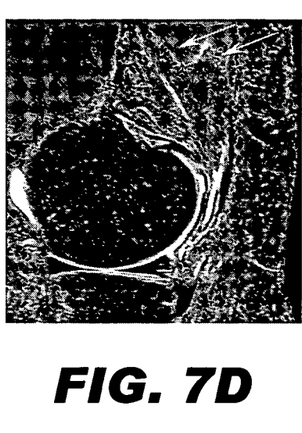
Figure 7E:
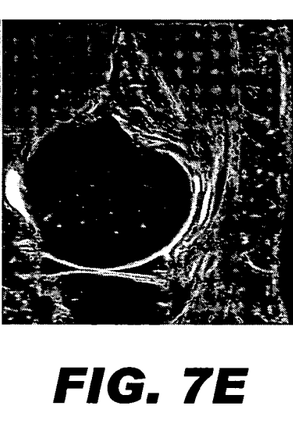
Figure 7F:
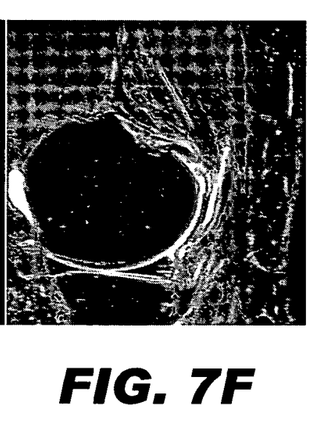
Figure 8A:
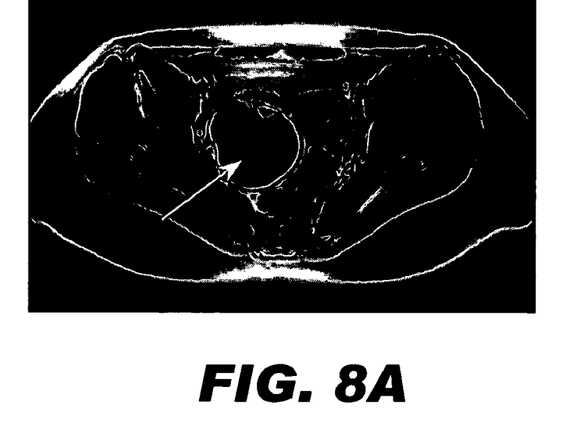
FIGS. 8A–8C are IDEAL recombined (a), calculated water (b), and calculated fat (c) images through the pelvis of a woman with a mature ovarian teratoma (long arrows) acquired using a torso phased array coil at 1.5T. The fat image clearly shows the extensive fat content of this mass, and the water image shows subtle amounts of free fluid (short arrow). Image parameters: TR/TE=5000/60, 384×
Figure 8B:
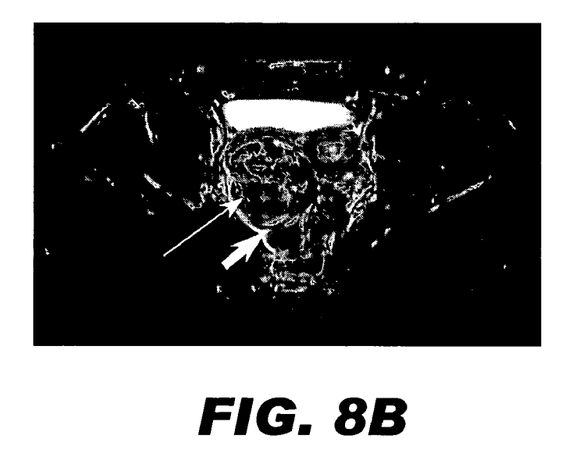
Figure 8C:
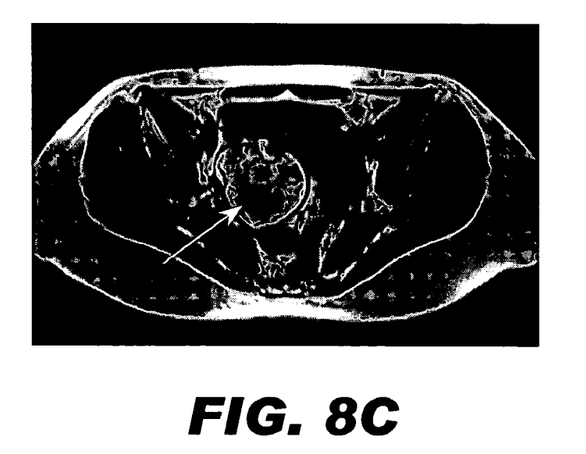
Figure 9A:
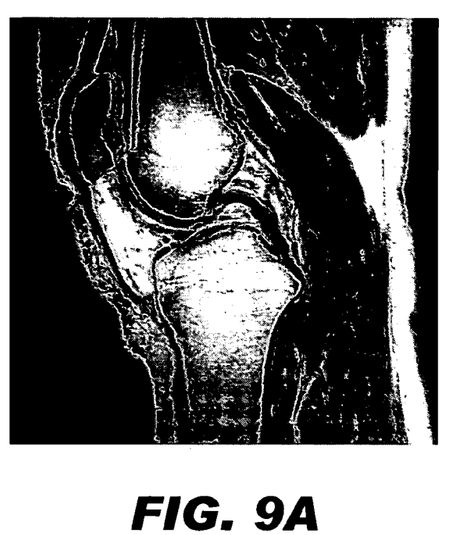
FIGS. 9A–9D are IDEAL recombined (a), calculated water (b), calculated fat (c) sagittal T2W FSE images acquired in the knee of a patient volunteer at 1.5T. Pre-patellar edema (long arrows) in the calculated water image is more accurately depicted in the IDEAL water image than in the fat-saturated T2W images that is shown for comparison (d). Areas of failed fat-saturation (short arrow) could have overestimated the extent of the pre-patellar edema. Scan time for the entire knee was 5:30 min for both IDEAL and fat-saturation methods. Image parameters: TR/TE=4000/48, 384×256, FOV=16 cm, slice/gap=2.5 mm/0.5 mm, echo train length=10, BW=±31.25 kHz, total scan time for knee=5:20 min.
Figure 9B:
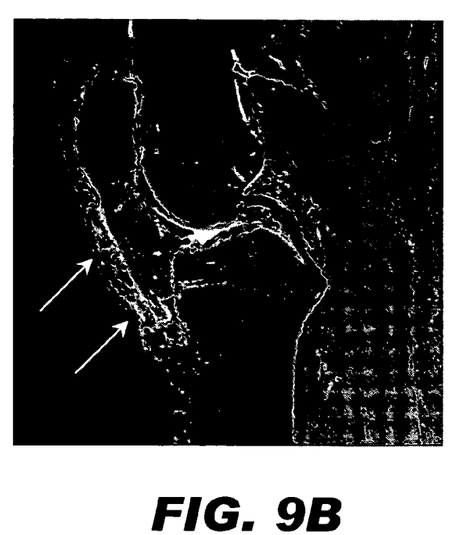
Figure 9C:
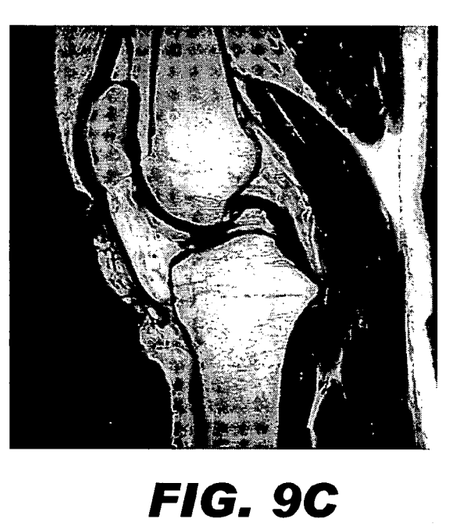
Figure 9D:
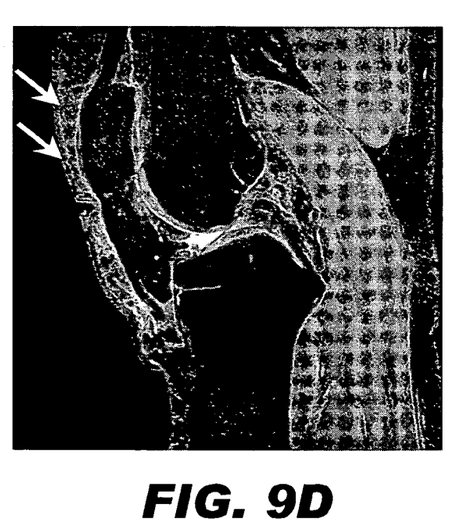
Figure 10A:
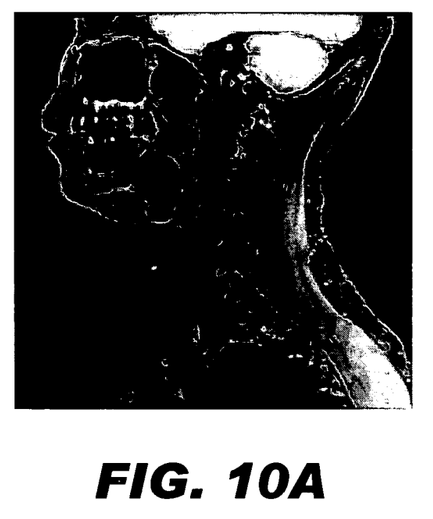
FIGS. 10A–10D are sagittal T1W IDEAL water (a) and fat-saturated T1W (b) images of the brachial plexus acquired with a phased array neurovascular coil. Coronal T2W IDEAL water (c) and fat-saturated (d) images are also shown. Tremendous improvement in the uniformity of fat-suppression is seen in both T1W and T2W IDEAL imaging. Note the "pseudo-tumor" appearance of the failed fat-saturation just superior to the lung apices (thin arrows) and other regions of failed fat-saturation (thick arrows). Image parameters for T2W images: TR/TE=4325/55, 384×192, FOV=24 cm, slice/gap=4.5 mm/0.5 mm, echo train length=10, BW=±20 kHz, total scan time for unilateral brachial plexus and cervical spine=4:33 min. Image parameters for T1W images: TR/TE=650/12, 384×192, FOV=24 cm, slice/gap=4.5 mm/0.5 mm, echo train length=2, BW=±20 kHz, total scan time for unilateral brachial plexus and cervical spine=6:20 min.
Figure 10B:
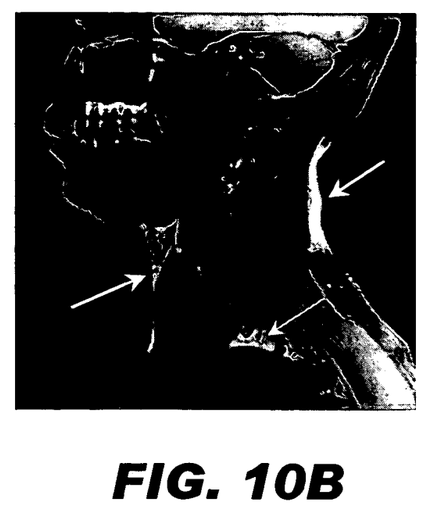
Figure 10C:
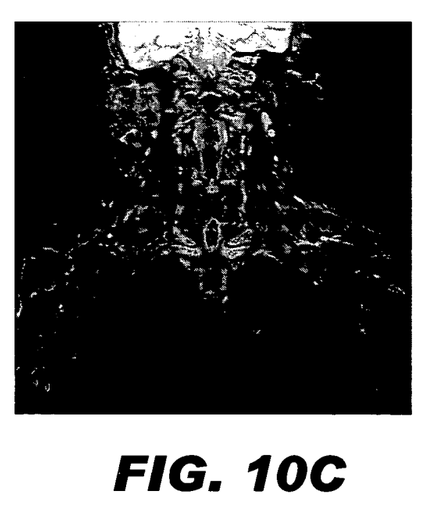
Figure 10D:
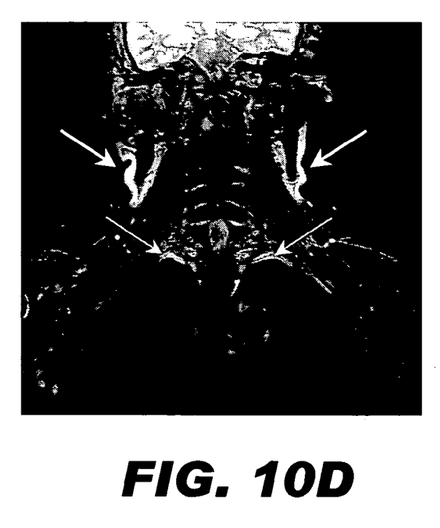
Figure 11A:
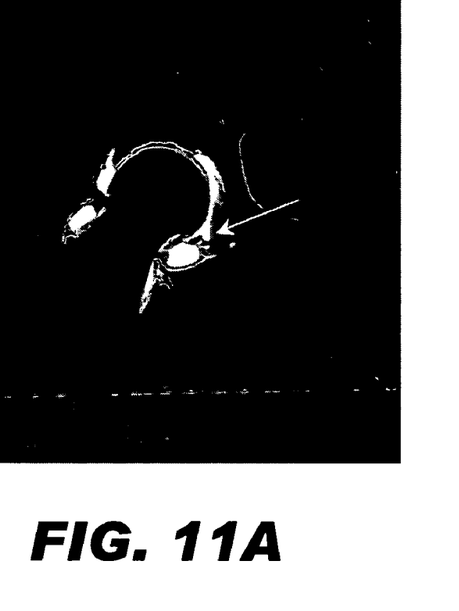
FIGS. 11A, 11B are coronal T1W IDEAL water images from two consecutive slices of a MR hip arthrogram performed after intra-articular injection of dilute Gd-DTPA. Excellent depiction of the transverse ligament (long arrow) and labrum (short arrow) is seen, with uniform suppression of fat across all images. Image parameters: TR/TE=600/12 ms, 384×192, FOV=20 cm, slice/gap=4 mm/0.5 mm, echo train length=2, BW=±32 kHz, NEX=2 ("no-phase wrap" on), total scan time for hip=6:30 min.
Figure 11B:
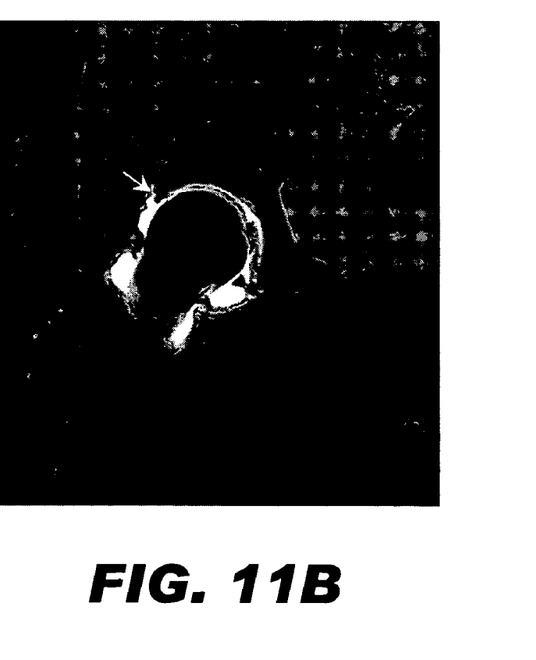

Phantom experiments were performed to quantitatively validate the theoretical noise behavior of the water-fat decomposition. A spherical phantom consisting of peanut oil floating on 0.9% normal saline doped with 5 mM $NiCl_2$ was imaged at 1.5T with a FSE pulse sequence modified to shift the readout gradient with respect to the spin-echoes. FIG. 4 shows axial calculated water (b) and fat (c) images, as well as a recombined (a) image through the oil-water phantom. From this plane an obliquely oriented slice was prescribed through the oil-water interface in order to create a continuum of fat:water ratios. An extremity coil and the following image parameters were used: $N_x$=256, $N_y$=256, averages=1, FOV=20 cm, slice=9 mm, echo train length (ETL)=16, BW=±31.3 kHz, TR/TE=700/13.1 ms. TR and TE were empirically chosen to produce similar signal intensity from both water and fat. Various combinations of symmetric and asymmetric echoes were used. Although the time between refocusing pulses (echo spacing) will vary with different echo shifts, it was fixed at 13.1 ms to ensure that the MR signal, as well as potential blurring in the phase encoding direction was identical for all cases. Product automated shim routines were used for all phantom imaging.

For each combination of echoes, phantom image acquisition was repeated 200 times (scan time=2 hrs 5 min, for 200 acquisitions), and water and fat images were reconstructed with an on-line algorithm based on an iterative least-squares algorithm, which easily accommodates arbitrary echo times. This algorithm uses a "robust" region growing reconstruction algorithm, to prevent water-fat ambiguities commonly seen with water-fat decomposition algorithms. The region growing algorithm uses field map estimates from nearby pixels to improve the initial guess of the field map, ensuring that the iterative algorithm converges to the correct solutions for the field map, water and fat. Although field map information is used from nearby pixels, it does not affect the noise performance of the water-fat decomposition for a given pixel. The reason for this is analogous to phase unwrapping algorithms used with other water-fat separation methods that use a binary algorithm to choose between two possible solution, leaving the noise performance of the solutions themselves unaffected. Smoothing of the field map estimate followed by computation of fat and water signals based on the locally smoothed field map can improve the SNR water-fat decomposition and may be useful. However, this can also introduce bias or deterministic errors in regions where the actual field map may not be smooth. The effect of field map smoothing on noise performance is an additional complexity that is beyond the scope of this work. NSA was calculated on an individual pixel basis as the quotient of the variance of each pixel from the three source images and the variance of the calculated water image (eq. 2). Pixels outside the phantom were excluded using a threshold mask. For each pixel, the fat:water ratio was calculated from the ratio of the average fat signal (computed over all 200 images) divided by the average water signal (computed over all 200 sets of three source images). In this way, scatter plots of measured NSA vs. fat:water ratio could be made. All NSA calculations (theoretical and experimental) were performed with off-line programs written in Matlab 6.0 (Mathworks, Natick, Mass.).

All human scanning was performed at 1.5T (Signa Twin-Speed, GE Healthcare, Milwaukee, Wis.) and 3.0T (Signa VH/i, GE Healthcare, Milwaukee, Wis.). The knees, abdomens, and brachial plexus of healthy volunteers and patients were imaged with approval of our investigational review board (IRB) and after obtaining informed consent. We used a modified FSE pulse sequence to acquire three images with different echo shifts. Fat-saturated FSE images were acquired for comparison in many cases. Abdominal and pelvic imaging was performed using a torso phased array coil, knee imaging was performed with an extremity coil and brachial plexus imaging was performed with a phased array neurovascular coil. All water-fat decomposition calculations were performed with an on-line reconstruction algorithm based on the iterative least-squares algorithm, which is capable of multi-coil reconstruction.

FIG. 5 shows recombined, water, and fat images acquired obliquely through the water-oil interface of the phantom described in FIG. 4, for both asymmetric (IDEAL) (a–c) and symmetric echoes (d–f). The IDEAL water image (g) and symmetric water image (h) are also shown with windowing that better demonstrates increased noise of the region that is mostly fat signal. The small amount of signal in this region most likely caused olefinic components of the oil that have resonant peaks very close to that of water, reflecting an inherent limitation of all methods of fat suppression that rely on the chemical shift between water and fat, including water-fat decomposition methods. The apparent increase in noise in the symmetric water image can be explained by the curves shown in FIG. 3A for high fat:water ratio. Note that FIG. 4 also shows very noisy signal in the calculated symmetric water and fat images where water and fat are in similar proportions (arrows). Drift in the magnitude and phase of these images due to possible system instability was not observed over the acquisition of the 200 images.

FIG. 6 plots experimental NSA from the phantom experiments as a function of fat:water ratio for four different echo combinations: $(-2\pi/3, 0, 2\pi/3)$; $(-2\pi/2, 0, \pi/2)$; $(-\pi/6, \pi/2, 7\pi/6)$; $(0, \pi/2, \pi)$. Theoretical predictions are shown as solid curves and very close agreement with experimental measurements is seen. The data from FIG. 6C were fit to the linear equation: NSA=slope*$\log_{10}$(fat:water ratio)+intercept. The intercept and slope were calculated to be 2.901±0.002, and 0.066±0.001, respectively, indicating very good agreement between experiment and theory. The apparent scatter of the experimentally measured NSA decreases when NSA approaches zero (FIGS. 6A, B). This occurs because NSA is the quotient of the source image variance, which remains constant over all fat:water ratios, and the variance of the calculated water images, which becomes very large when the fat:water ratio approaches one.

The theoretical and experimental plots of NSA performance are shown for the NSA of calculated water images only. A similar analysis was performed for the NSA of the calculated fat images, but not included for brevity. The theoretical and experimental NSA of calculated fat images demonstrated almost identical behavior. The main difference is that the horizontal axis (i.e.: fat:water ratio) is reversed. For example, the NSA of fat for symmetric echoes (−2π/3, 0, 2π/3) is three when the voxel contains all fat, instead of all water, etc.

FIGS. 7A–7F are sagittal T2W FSE images through the knee of a normal volunteer at 3.0T using a) symmetric echoes (−2π/3, 0, 2π/3), b) asymmetric echoes (−π/6, π/2, 7π/6) (IDEAL), and c) fat-saturation. Images in second row (d–f) are close up views of corresponding images in a–c. Note the irregular margins between muscle and fat in the symmetric echo image (white arrows), as well as increased noise in the bone marrow and subcutaneous fat. Image parameters: TR/TE=5000/48, 384×192, FOV=16 cm, slice/gap=3.0 mm/0.5 mm, echo train length=10, BW=±31.25 kHz, total scan time for entire knee=5:05 min. The figures show calculated water images from a T2-weighted sagittal knee acquisition at 3.0T acquired with symmetric echoes (phase shifts=−2π/3, 0, 2π/3; time shifts=−0.8 ms, 0 ms, 0.8 ms). For comparison, images acquired with the IDEAL method (phase shifts=−π/6, π/2, 7π/6, time shifts=−0.2 ms, 0.6 ms, 1.4 ms) and conventional fat-saturation are also shown, as well as magnified views of all three. Close inspection of these images reveals several artifacts in the symmetric acquisition. Pixels that occur at interfaces between muscle (water signal) and subcutaneous fat are very irregular and non-anatomic. In addition, the signal in the bone marrow as well as subcutaneous fat appears mottled and noisy. These artifacts are not seen in the IDEAL images and fat-saturated images. Image quality was notably improved for all images acquired with the IDEAL method compared with symmetric images (not shown).

Several clinical examples using IDEAL imaging are shown in FIGS. 8–11. FIGS. 8A–8C show recombined, water and fat images in the pelvis of a female patient with a right adnexal mass, obtained at 1.5T. Direct visualization of fat within this mass in the calculated fat image is diagnostic of a mature ovarian teratoma (dermoid). FIGS. 9A–9D show T2W FSE recombined, calculated water and fat images of the knee of a patient with pre-patellar edema. Comparison with fat-saturated T2W images shows an area of failed fat-saturation that would lead to erroneous overestimation of extent of the edema. FIGS. 10A–10D show examples of sagittal T1W and coronal T2W images of the brachial plexus and cervical spine acquired at 1.5T using a neurovascular coil. Comparison with fat-saturated images shows marked improvement in the uniformity of fat-suppression across the images. FIGS. 11A, 11B show two consecutive calculated water images from a T1W MR arthrogram, acquired at 1.5T with a torso phased array coil after intra-articular injection of dilute Gd-DTPA.

Echoes acquired symmetrically about a spin-echo can lead to the inability of estimation methods to resolve water from fat when they are in similar proportions within a voxel. This can lead to image artifacts such as irregular interfaces and increased noise in certain regions of the image. The maximum NSA of three can be achieved for all fat:water ratios by setting the phase of the middle image at π/2+πk (k=any integer) and spacing the other two images 2π/3 before and after the middle image. Theoretical predictions of the maximum NSA were verified experimentally with an oil-water phantom, for several combinations of symmetrical and asymmetrical echoes. Experimental noise performance matched theoretical predictions closely for both symmetric and asymmetric echoes, demonstrating that the iterative method is an efficient estimator that achieves the best possible NSA for a given echo combination. By using the IDEAL method, the noise performance of water-fat separation in pixels with varying proportions of fat is maximized, the dependence of NSA on fat:water ratio is eliminated, and image artifacts seen with symmetric echo acquisitions are avoided. Several clinical examples acquired with the IDEAL method were shown at both 1.5T and 3.0T, demonstrating the feasibility of both T1W and T2W imaging with high quality, high SNR multi-coil imaging with uniform water-fat separation.

Three-point water-fat separation methods that position the phase of the center at π/2, have been described by Xiang et al., and used by Ma et al. as part of a (0, π/2, π) combination. Although this choice of echoes helps to reduce the dependence of NSA on fat:water ratio (FIG. 6D), these implementations were not designed for this purpose. This choice of echoes has the primary advantage of simplifying analytical solutions that decompose water and fat.

Uniform noise performance across all fat:water ratios may be particularly important for special imaging applications that require quantification of the relative amounts of water and fat within tissues. Examples of such entities may include fatty liver seen with non-alcoholic steatohepatitis, adrenal masses, and many others.

As noted above, the invention is applicable to any imaging technique with echo-coherent time, and not just to spin-echoes. Once such technique is spoiled gradient echo (SPGR) imaging as described in the unpublished abstract of Reeder et al., "Water-Fat Separation with IDEAL-SPGR", which is attached hereto as a part of the application. GRASS and SSFP are examples of other suitable techniques.

Further, the method of computing the variance (or NSA) of the field map can apply to magnitude and phase of the species. Also, the choice of echo times is not restricted to −pi/6, pi/2, 7pi/6 (for shorter imaging time). Other subsets can be used including (pi/2−2pi/3j+pik, pi/2+pik, pi/2+2π/3j+pik) where k is an integer and j is any positive integer not divisible by 3. This is a general expression for equally spaced echoes with a middle echo at pi/2. An optimal choice of echoes for estimating phase using FSE and SSFP is (−2pi/3, 0, 2pi/3) and −4pi/3, 0, 4pi/3). Optimal echo times for estimating a field map is (−pi, 0, pi). Phase is important for measuring flow and temperature, while the field map is important for calibrating techniques which later assume the field map is known. More detailed descriptions are described in the unpublished paper of Pineda et al. "Cramer-Rao Bounds for 3-Point Decomposition of Water and Fat" which is attached hereto as part of the application.

Thus, the invention has been described with reference to specific embodiments. However, the description is illustrative of the invention and is not to be construed as limiting the invention. Various modifications and applications may occur to those skilled in the art without departing from the true spirit and scope of the invention as defined by the appended claims.

What is claimed is:

1. A method of separating signals from at least two species in a body using echo-coherent time magnetic resonance imaging comprising the steps of:
   a) acquiring a plurality of image signals, at acquisition times asymmetrically positioned with respect to an echo time wherein at least three image signals are acquired and the three signals are separated by $2\pi/3$ and the middle signal acquisition is centered at $\pi/2+\pi k$ where k is an integer, and
   b) combining the plurality of image signals iteratively by using a least squares decomposition algorithm.

2. The method of claim 1 wherein spin-echo imaging is used and two species are water and fat.

3. The method of claim 1 wherein in step a) image signal acquisition employs Dixon in-phase and out of phase imaging.

4. The method of claim 3 wherein the proportion of fat and water within a voxel is approximately equal.

5. The method of claim 1 wherein echo times are at $(\pi/2-2\pi/3j+\pi k, \pi/2+k, \pi/2+2\pi/3j+\pi k)$ where k is an integer and j is any positive integer not divisible by 3.

6. The method of claim 1 wherein the echo-coherent time magnetic resonance imaging is spin-echo.

7. The method of claim 1 wherein the echo-coherent time magnetic resonance imaging is spoiled gradient echo imaging (SPGR).

8. The method of claim 1 wherein the echo-coherent time magnetic resonance imaging is steady state free precession imaging (SSFP).

9. The method of claim 1 wherein the echo-coherent time magnetic resonance imaging is gradient recalled acquisition in steady state imaging (GRASS).

* * * * *